United States Patent [19]

Gambino et al.

[11] Patent Number: 5,915,183
[45] Date of Patent: Jun. 22, 1999

[54] RAISED SOURCE/DRAIN USING RECESS ETCH OF POLYSILICON

[75] Inventors: Jeffrey P. Gambino, Gaylordsville, Conn.; Scott Halle, Hopewell Junction, N.Y.; Jack A. Mandelman, Stormville, N.Y.; Jeremy K. Stephens, Wappingers Falls, N.Y.

[73] Assignee: International Business Machines Corporation, Armonk, N.Y.

[21] Appl. No.: 09/105,654

[22] Filed: Jun. 26, 1998

[51] Int. Cl.[6] .................................................. H01L 21/336
[52] U.S. Cl. .......................... 438/300; 438/683; 438/649
[58] Field of Search .................................... 438/300, 303, 438/683, 648, 649

[56] References Cited

U.S. PATENT DOCUMENTS

| | | | |
|---|---|---|---|
| 4,359,816 | 11/1982 | Abbas et al. | 438/303 |
| 4,471,522 | 9/1984 | Jambotkar | 438/303 |
| 4,816,884 | 3/1989 | Hwang et al. | 357/23.6 |
| 4,948,745 | 8/1990 | Pfiester et al. | 438/303 |
| 5,250,829 | 10/1993 | Bronner et al. | 257/301 |
| 5,270,234 | 12/1993 | Huang et al. | 438/303 |
| 5,376,578 | 12/1994 | Hsu et al. | 438/303 |
| 5,434,093 | 7/1995 | Chau et al. | 437/41 |
| 5,656,544 | 8/1997 | Bergendahl et al. | 438/386 |
| 5,682,055 | 10/1997 | Huang et al. | 257/408 |
| 5,773,358 | 6/1998 | Wu et al. | 438/300 |
| 5,786,255 | 7/1998 | Yeh et al. | 438/300 |

*Primary Examiner*—Tuan H. Nguyen
*Attorney, Agent, or Firm*—Scully, Scott, Murphy & Presser; Steven Capella

[57] ABSTRACT

A process for forming raised source/drain junctions using CMP (Chemical Mechanical Polishing) combined with a recess etch of blanket polysilicon. The raised source/drains are defined by gate conductors and by raised STI (Shallow Trench Isolation) which also reduces leakage current through the devices and improves the threshold voltage control. The process uses a salicide gate conductor, and uses conventional polysilicon deposition, CMP, and recess steps to form the raised source/drain junctions, such that it is readily implemented in commercially feasible manufacturing processes.

14 Claims, 2 Drawing Sheets

RAISED SOURCE/DRAIN USING RECESS ETCH OF POLYSILICON

FIELD OF THE INVENTION

The present invention relates generally to a process for forming raised source/drain junctions using recess etch of polysilicon. More particularly, the subject invention pertains to a process for forming raised source/drain junctions using CMP (Chemical Mechanical Polishing) combined with a recess etch of blanket polysilicon. The raised source/drains are defined by gate conductors and by raised STI (Shallow Trench Isolation) which also reduces leakage current through the devices and improves the threshold voltage control. The process of the invention uses a salicide gate conductor, and uses conventional polysilicon deposition, CMP, and recess steps to form the raised source/drain junctions, such that it is readily implemented in commercially feasible manufacturing processes.

BACKGROUND OF THE INVENTION

Raised source/drain junctions can provide shallow junctions with low series resistance. However, previously proposed processes for forming raised source/drain junctions have required either 1) selective epitaxy or 2) enhanced etching of polycrystalline Si compared to single crystal Si. Selective epitaxy is difficult to control, and suffers from spurious growth (on isolation), incomplete growth (on contaminated regions), and faceting. Achieving highly selective etching of polysilicon to single crystal Si is also difficult to achieve. Hence, a process for forming raised source/drain junctions is required which is more readily implemented in commercially feasible manufacturing processes.

U.S. Pat. No. 5,682,055 discloses a process for forming a polycide gate stack, and in particular discloses in FIG. 6A an embodiment for forming raised source/drain regions in which a polysilicon layer 44 is conformally deposited over the transistor gate, exposed substrate and the field oxide regions. It is preferably doped after it is deposited to a desired doping level to allow for separate doping of n- and p-type regions. Because of its conformality, in order to fill the opening 17 to form the raised source/drain regions, the polysilicon layer 44 is deposited to a thickness wherein the lowermost portion 46 of the polysilicon layer 44 is above the upper surface 22 of the field oxide regions 12 and preferably above the upper surface of the capping layer 30. A planar sacrificial layer 48, for example spin-on-glass or photoresist having an etch rate of 1:1 with the polysilicon layer 44 may be formed over the polysilicon layer 44.

Referring to FIG. 6B, an etch of the sacrificial layer 48 and the polysilicon layer 44 is performed to expose an upper surface of the field oxide regions 12 forming the raised source/drain regions 50 in opening 17. The etch chemistry is selective to the polysilicon so that the underlying layers are not etched. The etch may be a wet etch, dry etch, CMP or combination of these three, which are selective to the sacrificial layer 48 and the polysilicon layer 44, etching the sacrificial layer and the polysilicon layer at the same rate, but which does not substantially etch the sidewall spacers 34, the capping layer 30 or the silicide layer 28, if the capping layer is not formed, and the field oxide regions 12, including any etch stop layer formed.

The polysilicon raised source/drain regions 50 may also be silicided for both the transistor gate and the epitaxial raised source/drain regions. The silicide regions 52 of the polysilicon raised source/drain regions 50 also lowers the resistivity of the raised source/drain regions, while the raised source/drain regions 50 prevent an undesired amount of the substrate silicon from being consumed, again reducing the possibility of junction leakage and punch-through. The sidewall spacers 34 and capping layer 30 electrically isolate the raised source/drain regions 50 from the gate electrode 18 of the transistor.

The process described in U.S. Pat. No. 5,682,055 has several disadvantages. For example, the use of reactive ion etching to pattern the polysilicon for the raised source/drain contacts makes recess depth control difficult leading to inconsistent process results and inconsistent device performance.

Further, the process of U.S. Pat. No. 5,682,055 requires the use of a gate cap insulator. The requirement of a gate cap insulator makes it more difficult to fabricate dual work function devices (i.e., p+ and n+ gates on the same wafer) which are required for CMOS logic. More specifically, the use of a gate cap insulator means that the gates must be doped relatively early in the process (i.e., before the gate cap insulator is deposited). This often results in boron penetration of the gate oxide during subsequent anneals (sidewall oxidation, junction anneals), leading to poor control of the threshold voltage of the pFETs.

Hence, there is a desire for improved fabrication processes and designs which overcome the problems associate with processes and designs of U.S. Pat. No. 5,682,055.

SUMMARY OF THE INVENTION

Accordingly, it is a primary object of the present invention to provide a preferred process for making logic devices with raised source/drain junctions using recess etch of polysilicon.

A further object of the subject invention is the provision of a process for forming raised source/drain junctions using CMP (Chemical Mechanical Polishing) of blanket polysilicon combined with a recess etch. The raised source/drains are defined by gate conductors and by raised STI (Shallow Trench Isolation). The raised STI provides an additional benefit of reducing leakage current through the devices and improving the threshold voltage control. The process uses a salicide gate conductor. The disclosed process preferably uses conventional polysilicon deposition, CMP, and recess steps to form the raised source/drain junctions. Hence, it is more readily implemented in a commercially feasible manufacturing process than previously proposed processes.

The invention further encompasses raised source/drain designs having reduced profile relative to the surrounding STI.

These and other aspects of the invention are described in further detail below with reference to the drawings.

BRIEF DESCRIPTION OF THE DRAWINGS

In the accompanying drawings line elements are designated by identical reference numerals throughout the several views.

DETAILED DESCRIPTION OF THE INVENTION

The present invention provides a process for forming a raised source/drain using CMP (Chemical Mechanical Polishing) of blanket polysilicon combined with a recess etch. The raised source/drains are defined by the gate conductors and by raised STI (Shallow Trench Isolation). The raised STI provides an additional benefit of reducing leakage current through the devices and improving the threshold voltage control. The process is implemented with a salicide gate conductor in a preferred embodiment because of the advantages resulting therefrom. The invention further encompasses designs for raised source/drain features.

FIGS. 1–7 illustrate the sequential steps of a preferred embodiment of a process for forming raised source/drain junctions having salicide gate conductors.

Figure 1:
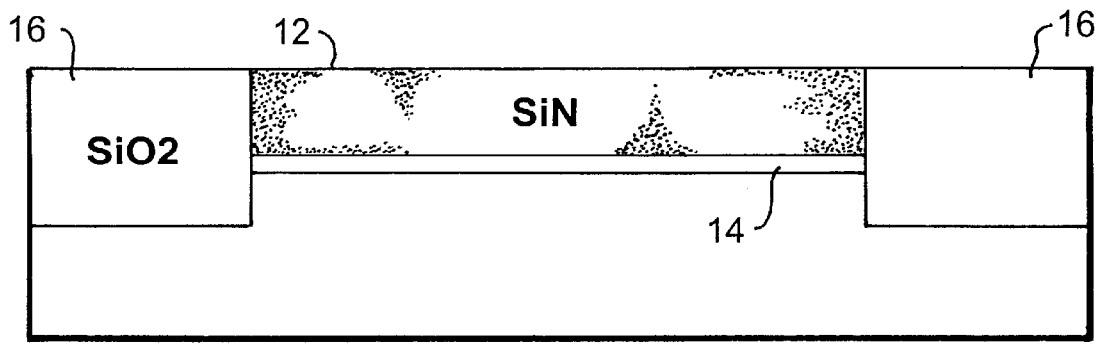
FIG. 1 illustrates a starting substrate wherein isolation trenches ((STI) Shallow Trench Isolation) have been etched therein and then filled with $SiO_2$.

Referring to FIG. 1, a starting substrate (a semiconductor material, preferably silicon) is provided with a silicon nitride layer 12 (preferably about 50–500 nm thick, more preferably about 150–250 nm, typically about 200 nm) on a pad oxide layer 14 (preferably about 5–50 nm thick, typically about 10 nm). Trenches are etched into the substrate (preferably to a depth of about 100–500 nm, more preferably about 200–300 nm, typically about 250 nm) preferably using suitable lithography and reactive ion etching (RIE) techniques. The trenches are filled with an appropriate isolation material, preferably $SiO_2$, deposited by low pressure chemical vapor deposition (LPCVD) or other suitable technique. Then, the isolation material is patterned, preferably by chemical mechanical polishing (CMP), to form the isolation trenches (STI) 16 as shown in FIG. 1.

Figure 2:
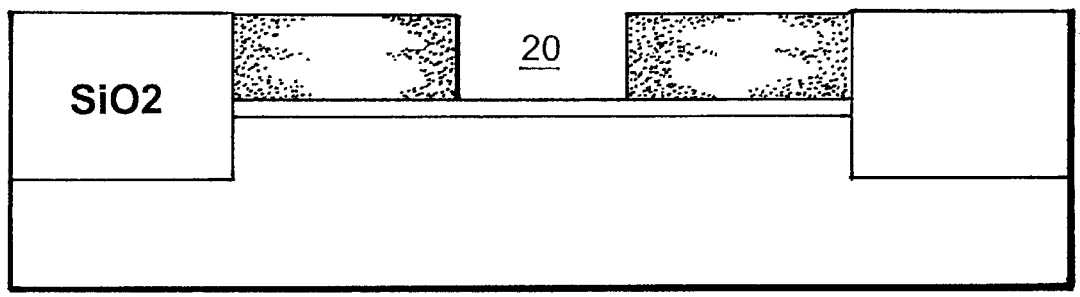
FIG. 2 illustrates etching of a trench for a gate conductor.

Referring to FIG. 2, a trench 20 is etched in the silicon nitride for the gate conductor, preferably using RIE. A medium selectivity etch is desired (e.g., $Si_3N_4:SiO_2=10:1$ etching rate ratio), so that there is some etching of the STI (above the active area), but preferably minimal etching of the pad oxide to avoid damaging the semiconductor (Si) substrate.

Figure 3:
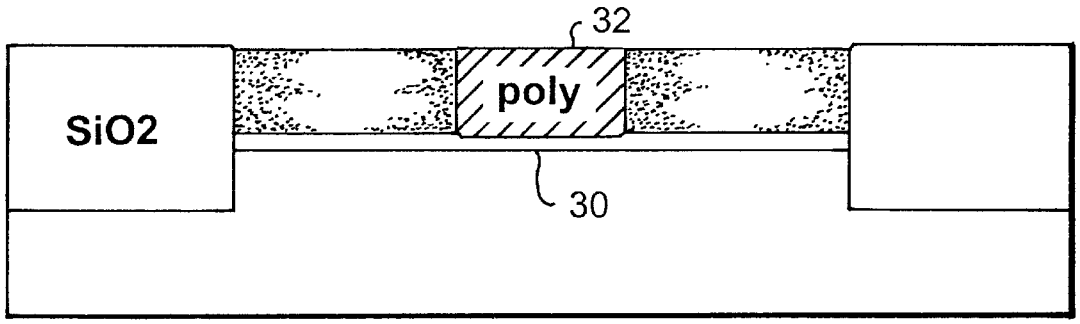
FIG. 3 illustrates a grown gate oxide, and the deposition of gate polysilicon thereover, followed by CMP patterning to form the gate conductor stack.

Referring to FIG. 3, the pad oxide 14 at the bottom of trench 20 is first removed with HF, and then a gate oxide 30 is regrown, preferably to a thickness of about 2–50 nm thick, typically about 5 nm. Polysilicon 32 for the gate conductor stack is deposited by LPCVD or other technique to a thickness of about 50–500 nm, more preferably about 100 nm–150 nm. Polysilicon 32 is then patterned by CMP to achieve the structure of FIG. 3 which has a relatively planar top provided by the CMP process.

Figure 4:
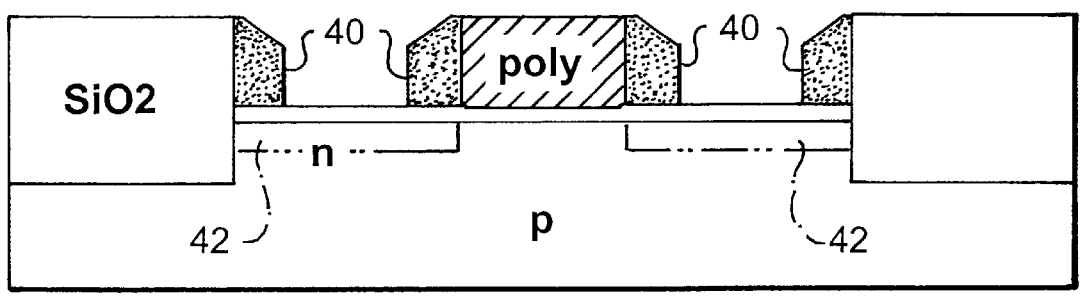
FIG. 4 illustrates the formation of spacers on the sidewalls of the gate conductor and the STI, and the formation of the source/drain junctions by doping of the substrate.

Referring to FIG. 4, the remaining $Si_3N_4$ is removed, preferably by a selective etch using $H_3PO_4$ and a temperature of about 25–200° C., more preferably about 160° C. Then, after slight sidewall oxidation to grow an oxide film (not shown) preferably to a thickness of about 5–20 nm, spacers 40 are formed preferably by LPCVD depositing about 20–100 nm, more preferably about 30 nm, of $Si_3N_4$, followed by a RIE spacer etch. Extension ion implant diffusions 42 for the source/drain junctions can be performed either prior to or after the spacer process if desired.

Figure 5:
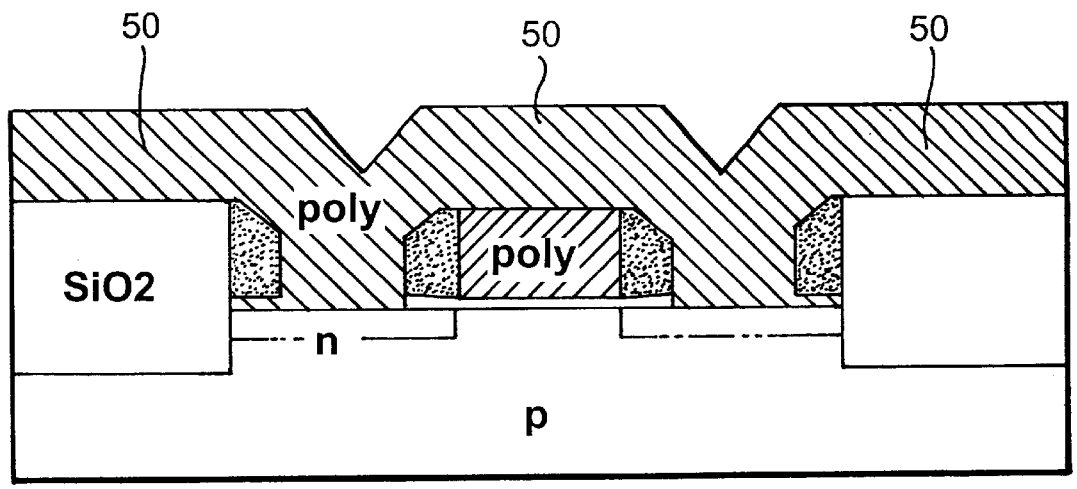
FIG. 5 illustrates the removal of the gate oxide, followed by the deposition of intrinsic polysilicon for the raised source/drains.

Referring to FIG. 5, intrinsic polysilicon 50 for the raised source/drains is conformally deposited, preferably by LPCVD, to a thickness of about 200–400 nm, more preferably about 300–350 nm. Prior to depositing polysilicon 50, oxide on the diffusions 42 is removed, preferably using a wet etch of dilute HF (e.g, $H_2O:HF$=about 10–500 by weight).

Figure 6:
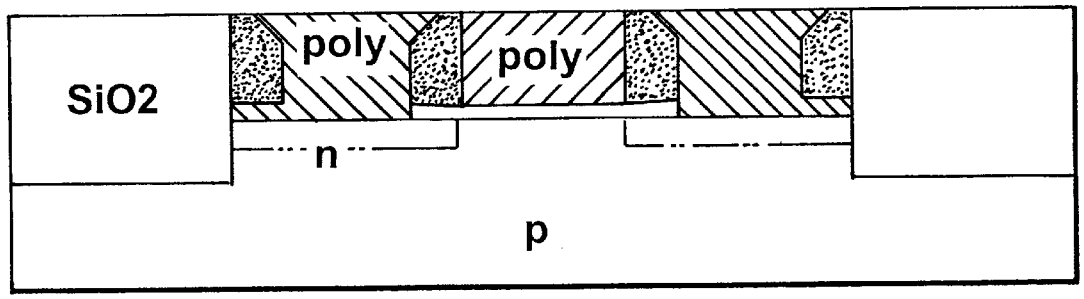
FIG. 6 illustrates patterning of the source/drain polysilicon by CMP (chemical Mechanical Polishing).

Referring to FIG. 6, the polysilicon 50 is patterned by CMP to achieve the structure with a relatively planar top, stopping on the gate conductor nitride 40. The use of CMP for this step enables superior depth control in the subsequent recessing step and contributes significantly to the improved reliability of the methods of the invention and the resulting end product. The CMP method to accomplish this step may be any conventional CMP technique normally used to planarize polysilicon materials in other processes.

Figure 7:
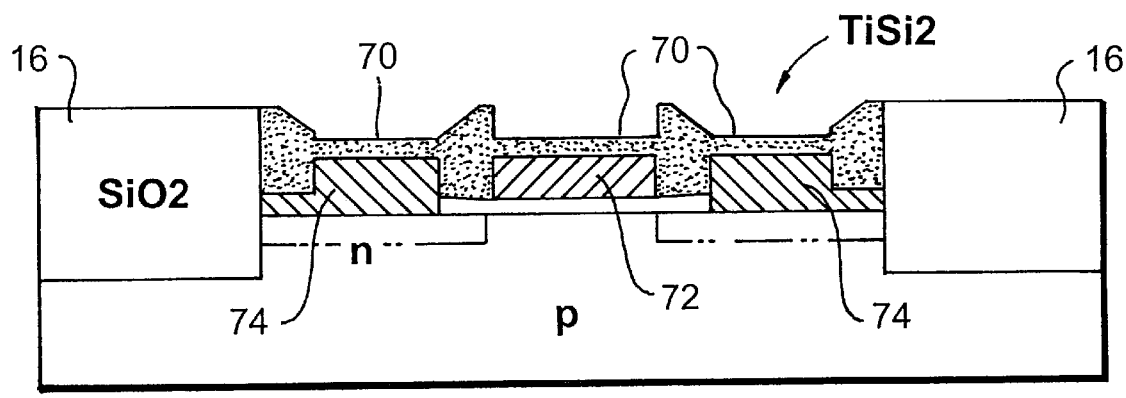
FIG. 7 illustrates recessing of the source/drain and gate polysilicon below the surface of the STI by an isotropic dry etch, followed by doping of the poly, and the formation of $TiSi_2$ on the gate and raised source/drain poly.

Referring to FIG. 7, the planarized polysilicon 50 is recessed below the top surface of the STI 16 (50–200 nm) preferably using an isotropic dry etch, such as chemical dry etching (CDE) in an F-based plasma. The recessed polysilicon can be doped by conventional techniques such as ion implantation and annealing. Finally, a salicide (e.g., $TiSi_2$) 70 is formed on the gate polysilicon 72 and raised source/drains polysilicon 74 using a conventional salicide process (i.e., metal deposition followed by annealing and wet etching). While $TiSi_2$ is a preferred salicide, other salicides such as NiSi, PtSi, and $CoSi_2$ can be used.

As noted above, the general processes of the invention provide improved reliability advantages compared to prior art methods of forming raised source/drain structures. Additionally, the processes of the invention can advantageously be used to form raised source/drain junctions that have a reduced profile which does not extend significantly above the profile of the surrounding STI. This design enables greater flexibility and ease in subsequent processing.

While several embodiments and variations of the present invention for a raised source/drain using recess etch of polysilicon are described in detail herein, it should be apparent that the disclosure and teachings of the present invention will suggest many alternative designs to those skilled in the art.

Having thus described our invention, what we claim as new, and desire to secure by Letters Patent is:

1. A process for forming a structure in a semiconductor substrate, said structure including raised source/drain junctions and a salicide gate conductor, said process comprising:

a. providing a semiconductor substrate containing (i) at least two shallow trench isolation (STI) elements formed by filling trenches in said substrate with an insulator material, (ii) a pad oxide layer on said semiconductor substrate between said STI elements, and (iii) a nitride layer overlying said pad oxide layer between said STI element;

b. etching a portion of said nitride layer to expose a portion of said pad oxide layer, thereby forming a gate conductor trench between two of said STI elements;

c. replacing said exposed pad oxide with a gate insulator;

d. depositing polysilicon over the gate insulator in said gate conductor trench to form a gate conductor;

e. removing said nitride layer from between said gate conductor and said two STI elements to expose sidewalls of said gate conductor and said STI elements;

f. forming insulation spacers on said exposed sidewalls, said spacers defining two source/drain trenches on opposite sides of said gate conductor;

g. blanket-depositing intrinsic polysilicon to fill said source/drain trenches and to cover said spacers and said two STI elements with said blanket-deposited intrinsic polysilicon;

h. chemical mechanical polishing the polysilicon deposited in step (g) to expose at least a portion of each of said spacers and to planarize said polysilicon in said source-drain and gate conductor trenches;

i. recessing said planarized polysilicon in said source/drain and gate conductor trenches to form recesses in said source/drain and gate conductor trenches, each recess being defined by two of said spacers and a recessed polysilicon surface;

j. doping the recessed polysilicon in said source/drain and gate conductor trenches; and k. forming a salicide in said recesses on the doped polysilicon to form said salicide gate conductor and raised source/drain junctions.

2. A process as claimed in claim 1, wherein the step (c) comprises forming a gate insulator by growing an oxide.

3. A process as claimed in claim 2, wherein step (c) further includes removing said pad oxide by etching with hydrofluoric acid, followed by said growing step.

4. A process as claimed in claim 1, wherein, following the step of forming insulating spacers, semiconductor surface is exposed in said source/drain trenches and a portion of said exposed semiconductor is doped.

5. A process as claimed in claim 1, wherein the substrate provided in step (a) is a silicon substrate, said oxide layer on said substrate has thickness of about 5 to 50 nm, and said nitride layer on said oxide layer has thickness of about 50 to 500 nm.

6. A process as claimed in claim 5, wherein the gate conductor trench is etched in the nitride by using reactive ion etching with a medium selectivity etch to provide etching of the STI elements, but minimal etching of the pad oxide to avoid damage to the semiconductor substrate.

7. A process as claimed in claim 1, wherein said STI elements have a depth of about 100 to 500 nm into the silicon substrate.

8. A process as claimed in claim 1, wherein the polysilicon is deposited in step (d) by low pressure chemical vapor deposition followed by chemical mechanical polishing to remove polysilicon deposited outside said gate conductor trench.

9. A process as claimed in claim 1, wherein the intrinsic polysilicon is deposited in step (g) by low pressure chemical vapor deposition.

10. A process as claimed in claim 1, wherein the recessing is performed by isotropic dry etch of said source/drain and gate polysilicon.

11. A process as claimed in claim 10, wherein said dry isotropic etching comprises chemical dry etching in a fluoride-based plasma.

12. A process as claimed in claim 1 wherein pad oxide remaining between said STI elements is removed from said substrate between steps (f) and (g).

13. A process as claimed in claim 1 wherein polysilicon is removed from over said STI elements in step (h) whereby said STI elements are free of any overlying polysilicon prior to recessing step (I).

14. A process as claimed in claim 1 wherein said salicide is formed by depositing a metal on said recessed polysilicon, reacting said metal and said polysilicon to form a salicide, and removing unreacted metal by wet etching.

* * * * *

UNITED STATES PATENT AND TRADEMARK OFFICE
CERTIFICATE OF CORRECTION

PATENT NO. : 5,915,183
DATED : June 22, 1999
INVENTOR(S) : Jeffrey P. Gambino, et al.

It is certified that error appears in the above-identified patent and that said Letters Patent is hereby corrected as shown below:

On the Title page, and in col.1, line 3, item [54]:
"RAISED SOURCE/DRAIN USING RECESS ETCH OF POLYSILICON" should read --PROCESS FOR FORMING RAISED SOURCE/DRAIN JUNCTIONS USING ETCH OF POLYSILICON--

Signed and Sealed this

Twenty-eighth Day of December, 1999

Attest:

Q. TODD DICKINSON

*Attesting Officer*    *Acting Commissioner of Patents and Trademarks*